(12) United States Patent
Kim et al.

(10) Patent No.: US 10,840,285 B2
(45) Date of Patent: Nov. 17, 2020

(54) IMAGE SENSOR

(71) Applicant: SAMSUNG ELECTRONICS CO., LTD., Suwon-si (KR)

(72) Inventors: Kook Tae Kim, Hwaseong-si (KR); Jingyun Kim, Hwaseong-si (KR); Kyunghee Kim, Pyeongtaek-si (KR); Jaewoong Lee, Hwaseong-si (KR); Soojin Hong, Guri-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/535,762

(22) Filed: Aug. 8, 2019

(65) Prior Publication Data
US 2020/0227449 A1     Jul. 16, 2020

(30) Foreign Application Priority Data

Jan. 11, 2019 (KR) .................. 10-2019-0003957

(51) Int. Cl.
  *H01L 27/146* (2006.01)
(52) U.S. Cl.
  CPC .... *H01L 27/1463* (2013.01); *H01L 27/14636* (2013.01)
(58) Field of Classification Search
  CPC ............. H01L 27/1463; H01L 27/14636
  USPC ........................................... 257/446
  See application file for complete search history.

(56) References Cited

U.S. PATENT DOCUMENTS

| | | | |
|---|---|---|---|
| 7,816,752 B2 | 10/2010 | Mori | |
| 8,507,962 B2 | 8/2013 | Anderson et al. | |
| 8,664,578 B2 | 3/2014 | Hirigoyen et al. | |
| 8,964,081 B2 | 2/2015 | Ohkubo et al. | |
| 9,054,007 B2 | 6/2015 | Hu et al. | |
| 9,484,370 B2 | 11/2016 | Leung et al. | |
| 9,741,759 B2 | 8/2017 | Park | |
| 9,761,624 B2 | 9/2017 | Velichko et al. | |
| 2015/0255495 A1* | 9/2015 | Park | H01L 27/1462 257/432 |
| 2018/0190691 A1 | 7/2018 | Lee et al. | |

* cited by examiner

*Primary Examiner* — Elias Ullah
(74) *Attorney, Agent, or Firm* — Sughrue Mion, PLLC

(57) ABSTRACT

An image includes a semiconductor substrate having a first surface and a second surface that face each other; a first photoelectric conversion region and a second photoelectric conversion region provided in the semiconductor substrate; a gapfill pattern that is interposed between the first and second photoelectric conversion regions and extends from the second surface toward the first surface, wherein a first side surface of the gapfill pattern faces the first photoelectric conversion region and a second side surface of the gapfill pattern faces the second photoelectric conversion region; and a conductive pattern disposed on the gapfill pattern. The conductive pattern includes a first portion disposed on the first side surface, a second portion disposed on the second side surface, and a connecting portion that is disposed on a top surface of the gapfill pattern and electrically connects the first portion to the second portion.

20 Claims, 18 Drawing Sheets

IMAGE SENSOR

CROSS-REFERENCE TO RELATED APPLICATION

This application claims priority from Korean Patent Application No. 10-2019-0003957, filed on Jan. 11, 2019, in the Korean Intellectual Property Office, the entire contents of which are hereby incorporated by reference.

BACKGROUND

Field

Example embodiments of the present disclosure relate to an image sensor, and in particular, to a complementary metal-oxide-semiconductor (CMOS) image sensor.

Related Art

An image sensor is an electronic device that converts optical images into electrical signals. With the recent advances in the computer and communications industries, there is an increased demand for high performance image sensors in a variety of applications such as digital cameras, camcorders, personal communication systems, gaming machines, security cameras, micro-cameras for medical applications, and/or robots.

Image sensors may be generally classified into charge-coupled-device (CCD) sensors and complementary metal-oxide-semiconductor (CMOS) image sensors. Because CMOS image sensors have a relatively simple operation method and can be provided in the form of a single chip, in which signal processing circuits are integrated, it is possible to reduce a size of a product therewith. In addition, because CMOS image sensors consume a relatively low amount of power, CMOS image sensors are frequently implemented in electronic devices with a limited battery capacity. Furthermore, CMOS image sensors can be fabricated using CMOS fabrication techniques, and thus, it is possible to reduce a manufacturing cost thereof. Moreover, CMOS image sensors can provide high resolution images.

SUMMARY

One or more example embodiments an image sensor with a reduced dark current property.

One or more example embodiments a method of fabricating an image sensor with improved light sensitivity.

According to an aspect of an example embodiment, there is provided an image sensor that includes a semiconductor substrate having a first surface and a second surface, the first surface and the second surface facing each other; a first photoelectric conversion region provided in the semiconductor substrate; a second photoelectric conversion region provided in the semiconductor substrate; a gapfill pattern that is interposed between the first photoelectric conversion region and the second photoelectric conversion region and extends from the second surface toward the first surface, wherein a first side surface of the gapfill pattern faces the first photoelectric conversion region and a second side surface of the gapfill pattern faces the second photoelectric conversion region; and a conductive pattern disposed on the gapfill pattern. The conductive pattern includes a first portion disposed on the first side surface, a second portion disposed on the second side surface, and a connecting portion that is disposed on a top surface of the gapfill pattern and electrically connects the first portion to the second portion.

According to an aspect of an example embodiment, there is provided an image sensor that includes a semiconductor substrate including a plurality of pixel regions interposed between a first surface and a second surface of the semiconductor substrate; and a pixel separation structure that extends from the first surface to the second surface and separates the plurality of pixel regions from each other. The pixel separation structure includes a conductive pattern, a capping pattern disposed on the conductive pattern, and a gapfill pattern provided in the conductive pattern, a bottom surface of the gapfill pattern is exposed through the conductive pattern, and a top surface of the gapfill pattern is spaced apart from a bottom surface of the capping pattern, with the conductive pattern interposed therebetween.

According to an aspect of an example embodiment, there is provided an image sensor that includes a semiconductor substrate having a first surface and a second surface, and including a pixel region with a photoelectric conversion region; a pixel separation structure having a lattice structure that encloses the pixel region, the pixel separation structure including a conductive pattern, a capping pattern disposed on the conductive pattern, and a gapfill pattern provided in the conductive pattern; and a device isolation pattern formed in the semiconductor substrate, adjacent to the first surface, and in contact with the pixel separation structure. A top surface of the device isolation pattern is coplanar with a top surface of the capping pattern, and a bottom surface of the conductive pattern is coplanar with a bottom surface of the gapfill pattern.

BRIEF DESCRIPTION OF THE DRAWINGS

The above and other aspects, features and advantages will be more clearly understood from the following brief description taken in conjunction with the accompanying drawings.

DETAILED DESCRIPTION

Example embodiments will now be described more fully with reference to the accompanying drawings, in which example embodiments are shown.

Figure 1:
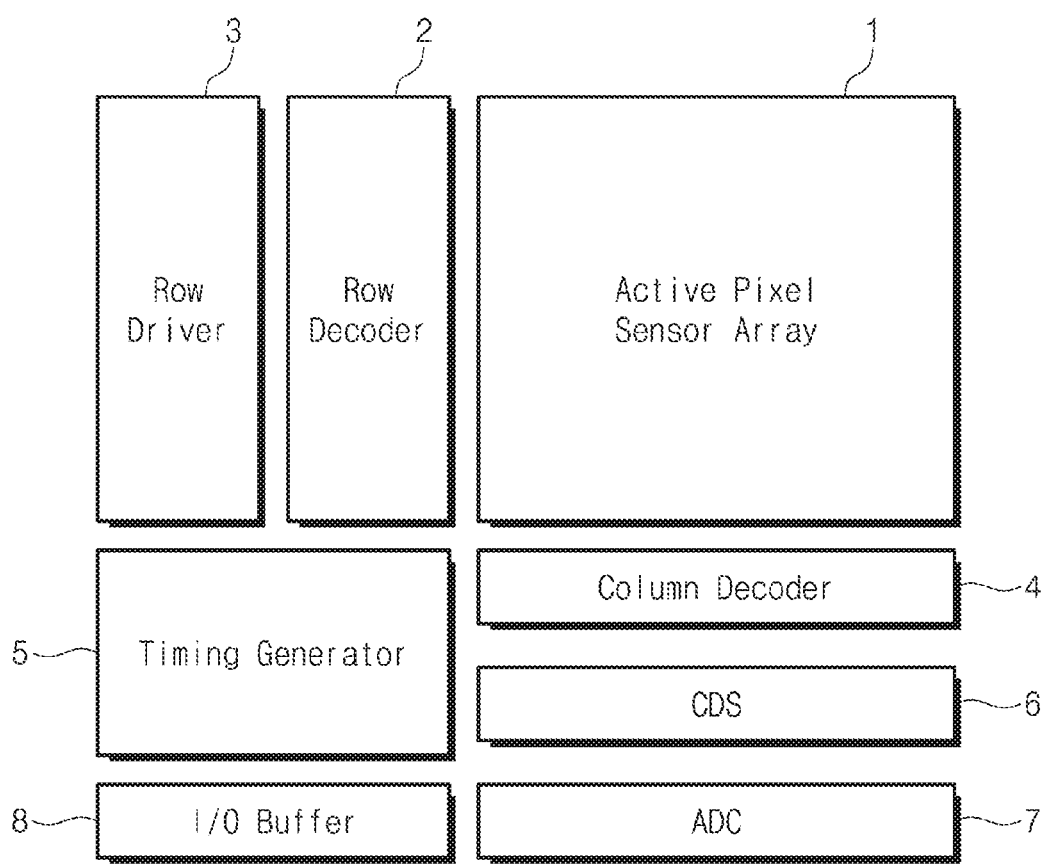
FIG. 1 is a block diagram illustrating an image sensor according to an example embodiment.

FIG. 1 is a block diagram illustrating an image sensor according to an example embodiment.

Referring to FIG. 1, an image sensor may include an active pixel sensor array 1, a row decoder 2, a row driver 3, a column decoder 4, a timing generator 5, a correlated double sampler (CDS) 6, an analog-to-digital converter (ADC) 7, and an I/O buffer 8.

The active pixel sensor array 1 may include a plurality of unit pixels, which are two-dimensionally arranged, and may be used to convert optical signals to electrical signals. The active pixel sensor array 1 may be driven by a plurality of driving signals (e.g., a pixel-selection signal, a reset signal, and a charge-transfer signal), transmitted from the row driver 3. The converted electrical signals may be transmitted to the correlated double sampler 6.

The row driver 3 may be configured to generate driving signals for driving the unit pixels, based on information decoded by the row decoder 2, and to transmit the driving signals to the active pixel sensor array 1. When the unit pixels are arranged in a matrix (i.e., in rows and columns), the driving signals may be provided to respective rows.

The timing generator 5 may be configured to provide timing and control signals to the row decoder 2 and the column decoder 4.

The correlated double sampler 6 may be configured to receive the electric signals generated in the active pixel sensor array 1 and perform an operation of holding and sampling the received electric signals. For example, the correlated double sampler 6 may perform a double sampling operation using a specific noise level and a signal level of the electric signal, and output a difference level corresponding to a difference between the noise and signal levels.

The analog-to-digital converter 7 may be configured to convert an analog signal to a digital signal. For example, the analog-to-digital converter 7 may convert an analog signal which contains information on the difference level outputted from the correlated double sampler 6 to a digital signal.

The I/O buffer 8 may be configured to latch the digital signals and sequentially output the latched digital signals to an image signal processor based on information decoded by the column decoder 4.

Figure 2:
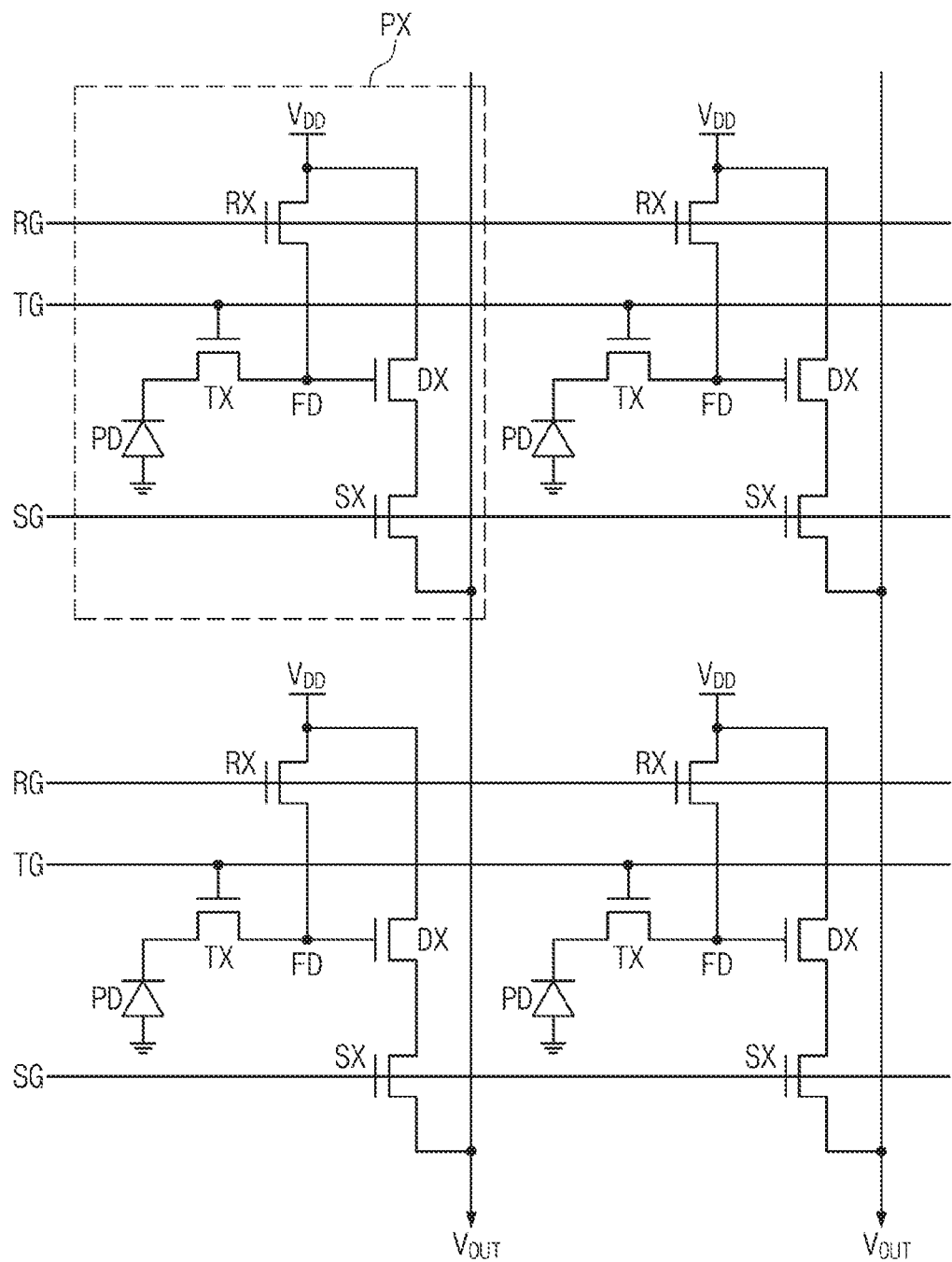
FIG. 2 is a circuit diagram of an active pixel sensor array of an image sensor according to an example embodiment.

FIG. 2 is a circuit diagram of an active pixel sensor array of an image sensor according to an example embodiment.

Referring to FIGS. S1 and 2, the active pixel sensor array 1 may include a plurality of unit pixels PX, which are arranged in a matrix. Each of the unit pixels PX may include a transfer transistor TX, a reset transistor RX, a selection transistor SX, and a drive transistor DX. The reset transistor RX, the selection transistor SX, and the drive transistor DX may be referred to as logic transistors. The transfer transistor TX may include a transfer gate TG. Each of the unit pixels PX may further include a photoelectric conversion device PD (i.e., a photoelectric converter) and a floating diffusion region FD.

The photoelectric conversion device PD may be configured to generate photocharges proportional to an amount of light that is incident thereon and to store the photocharges. The photoelectric conversion device PD may include a photo diode, a photo transistor, a photo gate, a pinned photo diode, or any combination thereof. The transfer transistor TX may be configured to transfer electric charges, which are generated in the photoelectric conversion device PD, to the floating diffusion region FD. The floating diffusion region FD may be configured to receive the charges, which are generated in the photoelectric conversion device PD, and to cumulatively store them therein. The drive transistor DX may be controlled by an amount of the photocharges stored in the floating diffusion region FD.

The reset transistor RX may be configured to periodically discharge the photocharges stored in the floating diffusion region FD. The reset transistor RX may include a drain electrode connected to the floating diffusion region FD and a source electrode connected to a power voltage VDD. When the reset transistor RX is turned on, the power voltage VDD may be applied to the floating diffusion region FD through the source electrode of the reset transistor RX. Accordingly, the electric charges stored in the floating diffusion region FD may be discharged through the reset transistor RX while the reset transistor RX is in the turned-on state. As a result, the floating diffusion region FD may be reset to a reset state.

The drive transistor DX may serve as a source follower buffer amplifier. The drive transistor DX may be configured to amplify a variation in electric potential of the floating diffusion region FD and to output the amplified signal to an output line Vout.

The selection transistor SX may be used to select a row of the unit pixels PX for a read operation. When the selection transistor SX is turned on, the power voltage VDD may be applied to a drain electrode of the drive transistor DX.

Figure 3:
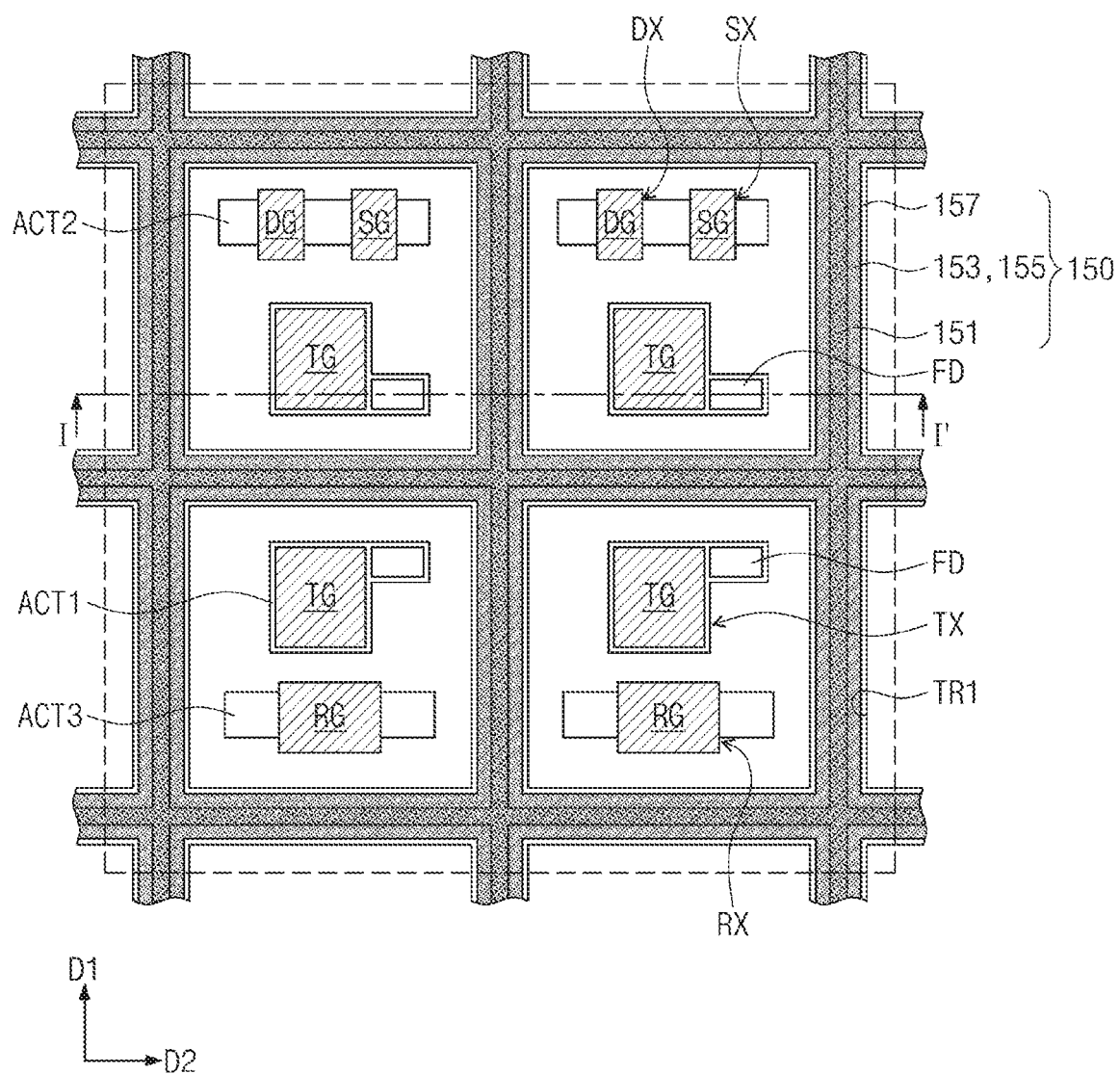
FIG. 3 is a plan view illustrating an image sensor according to an example embodiment.
Figure 4:
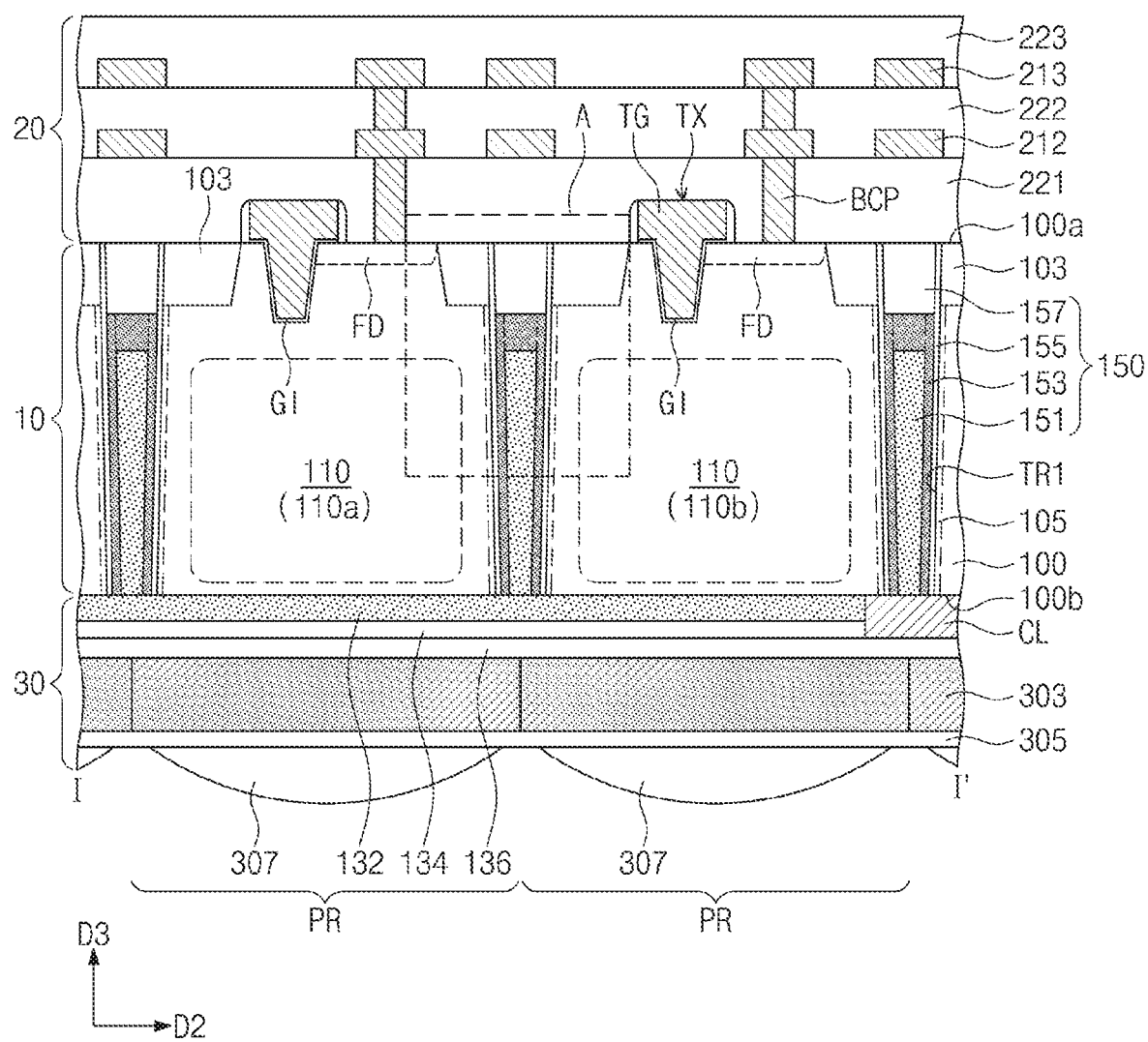
FIG. 4 is a sectional view taken along line I-I' of FIG. 3.

FIG. 3 is a plan view illustrating an image sensor according to an example embodiment. FIG. 4 is a sectional view taken along a line I-I' of FIG. 3.

Referring to FIGS. 3 and 4, an image sensor according to an example embodiment may include a photoelectric conversion layer 10, an interconnection layer 20, and a light transmission layer 30. The photoelectric conversion layer 10 may be disposed between the interconnection layer 20 and the light transmission layer 30. The photoelectric conversion layer 10 may include a semiconductor substrate 100 and photoelectric conversion regions 110, which are provided in the semiconductor substrate 100. The photoelectric conversion regions 110 may be configured to convert light, which is incident thereon (i.e., from the outside), to electrical signals.

The semiconductor substrate 100 may have a first surface 100a and a second surface 100b facing each other. The interconnection layer 20 may be disposed on the first surface 100a of the semiconductor substrate 100, and the light transmission layer 30 may be disposed on the second surface 100b of the semiconductor substrate 100.

The semiconductor substrate 100 may be a substrate, in which an epitaxial layer of a first conductivity type (e.g., p-type) is formed on a bulk silicon wafer of the first conductivity type. In some example embodiments, the bulk silicon wafer may be removed during a process of fabricating the image sensor, and in this case, only the p-type epitaxial layer may remain in the semiconductor substrate 100. In some example embodiments, the semiconductor substrate 100 may be a bulk semiconductor wafer, in which a well of the first conductivity type is formed. Various kinds of substrates (e.g., an n-type epitaxial layer, a bulk silicon wafer, and a silicon-on-insulator (SOI) wafer) may be used as the semiconductor substrate 100.

The semiconductor substrate 100 may include a plurality of pixel regions PR segmented by a pixel separation structure 150. Each of the pixel regions PR may correspond to the unit pixel PX of FIGS. 1 and 2. The pixel regions PR may be arranged in a matrix or in two different directions (e.g., a first direction D1 and a second direction D2). The pixel separation structure 150 may prevent photocharges, which are produced by light incident on the pixel region PR, from entering neighboring pixel regions PR through a random drift phenomenon. In other words, the pixel separation structure 150 may prevent a cross-talk phenomenon from occurring between the pixel regions PR.

When viewed in a plan view, the pixel separation structure 150 may have a lattice or grid structure. When viewed in a plan view, the pixel separation structure 150 may completely enclose each of the pixel regions PR. The pixel separation structure 150 may extend from the first surface 100a of the semiconductor substrate 100 toward the second surface 100b. In an example embodiment, the pixel separation structure 150 may penetrate the semiconductor substrate 100. In other words, a vertical length of the pixel separation structure 150 may be substantially the same as a vertical thickness of the semiconductor substrate 100. The pixel separation structure 150 may have a tapered shape. For example, a width of the pixel separation structure 150 may decrease in a direction from the first surface 100a of the semiconductor substrate 100 toward the second surface 100b. A detailed structure of the pixel separation structure 150 will be described with reference to FIGS. 5A, 5B, 5C and 5D below.

The photoelectric conversion regions 110 may be disposed in the pixel regions PR, respectively. The photoelectric conversion regions 110 may be impurity regions, which are doped to have a second conductivity type (e.g., n-type) different from that of the semiconductor substrate 100. The photoelectric conversion regions 110 may be formed to be closer to the second surface 100b than to the first surface 100a. For example, the photoelectric conversion regions 110 may be adjacent to the second surface 100b of the semiconductor substrate 100. Each of the photoelectric conversion regions 110 may include a first region that faces the first surface 100a and a second region that faces the second surface 100b. There may be a difference in impurity concentration between the first region and the second region of the photoelectric conversion region 110. This may lead to a non-vanishing gradient of potential in the photoelectric conversion region 110, between the first surface 100a and the second surface 100b of the semiconductor substrate 100.

The photoelectric conversion region 110 may be configured to function as a photodiode together with the semiconductor substrate 100. For example, the semiconductor substrate 100 of the first conductivity type and the photoelectric conversion region 110 of the second conductivity type may form a pn junction, which can be used as a photodiode. An amount of photocharges, which are produced and accumulated in the photoelectric conversion region 110 or the photodiode, may be proportional to an intensity of light incident on the photoelectric conversion region 110.

A device isolation pattern 103 may be provided on the first surface 100a of the semiconductor substrate 100 to define first active patterns ACT1, second active patterns ACT2, and third active patterns ACT3. The device isolation pattern 103 may have a width that decreases in a direction from the first surface 100a of the semiconductor substrate 100 toward the second surface 100b. A bottom surface of the device isolation pattern 103 may be vertically spaced apart from the photoelectric conversion regions 110. A depth of the device isolation pattern 103 may be less than a depth of the pixel separation structure 150. The pixel separation structure 150 may be overlapped with a portion of the device isolation pattern 103.

Each of the pixel regions PR may include the first active pattern ACT1 defined by the device isolation pattern 103. The first active pattern ACT1 may be placed at a center region of the pixel region PR. The first active pattern ACT1 may have a 'L'-shaped planar shape. The pixel regions PR may include the second active pattern ACT2 or the third active pattern ACT3. The second active pattern ACT2 and the third active pattern ACT3 may be defined by the device isolation pattern 103. When viewed in a plan view, each of the second and third active patterns ACT2 and ACT3 may be placed near an edge of the pixel region PR. Each of the second and third active patterns ACT2 and ACT3 may be a bar-shaped pattern extending in the second direction D2. The planar shapes of the first to third active patterns ACT1, ACT2, and ACT3 may not be limited to the example shown in FIG. 3 and may be variously changed. In an example embodiment, unlike that shown in FIG. 3, each of the pixel regions PR may include all of the first to third active patterns ACT1, ACT2, and ACT3. In this case, the first active pattern ACT1 may be disposed between the second active pattern ACT2 and the third active pattern ACT3.

The transfer transistors TX and the logic transistors RX, SX, and DX, which have been previously described with reference to FIG. 2, may be provided on the first surface 100a of the semiconductor substrate 100.

The transfer transistor TX may be provided on the first active pattern ACT1 of each of the pixel regions PR. The transfer transistor TX may include the transfer gate TG, which is provided on the first active pattern ACT1, and the floating diffusion region FD. The transfer gate TG may include a lower portion, which is inserted into the semiconductor substrate 100, and an upper portion, which is connected to the lower portion and has a shape upwardly protruding from the first surface 100a of the semiconductor substrate 100. A gate dielectric layer GI may be interposed between the transfer gate TG and the semiconductor substrate 100. The floating diffusion region FD may be formed in a portion of the first active pattern ACT1, which is located at a side of the transfer gate TG. The floating diffusion region FD may have a second conductivity type (e.g., n-type), which is different from that of the semiconductor substrate 100. The drive transistor DX and the selection transistor SX may be provided on the second active pattern ACT2. The drive transistor DX may include a drive gate DG, and the selection transistor SX may include a selection gate SG. The drive gate DG and the selection gate SG may be provided on the second active pattern ACT2. The reset transistor RX may be provided on the third active pattern ACT3. The reset transistor RX may include a reset gate RG on the third active pattern ACT3. A gate dielectric layer may be interposed between each of the drive, selection and reset gates DG, SG, and RG and the semiconductor substrate 100.

The interconnection layer 20 may include first to third interlayered insulating layers 221, 222, and 223 and first and second interconnection lines 212 and 213. The first interlayered insulating layer 221 may be provided on the first surface 100a of the semiconductor substrate 100 to cover the transfer transistors TX and the logic transistors RX, SX, and DX. The first and second interconnection lines 212 and 213 may be provided in the second and third interlayered insulating layers 222 and 223, respectively, which are stacked on the first interlayered insulating layer 221.

The first and second interconnection lines 212 and 213 may be electrically connected to the transfer transistors TX and the logic transistors RX, SX, and DX through first contacts BCP, which are formed to penetrate the first interlayered insulating layer 221. In an example embodiment, the first and second interconnection lines 212 and 213 may be arranged, regardless of the arrangement of the photoelectric conversion regions 110. When viewed in a plan view, the first and second interconnection lines 212 and 213 may cross the photoelectric conversion regions 110.

The light transmission layer 30 may include color filters 303 and micro lenses 307. The light transmission layer 30 may be configured to perform a condensing and filtering operation on light, which is incident from the outside, and to provide the light to the photoelectric conversion layer 10.

In detail, the color filters 303 and the micro lenses 307 may be provided on the second surface 100b of the semiconductor substrate 100. The color filters 303 may be disposed on the pixel regions PR, respectively. The micro lenses 307 may be disposed on the color filters 303, respectively. An anti-reflection layer 132 and first and second insulating layers 134 and 136 may be disposed between the second surface 100b of the semiconductor substrate 100 and the color filters 303. The anti-reflection layer 132 may be configured to prevent light, which is incident into the second surface 100b of the semiconductor substrate 100, from being reflected, and this may allow the incident light to be effectively incident into the photoelectric conversion layer 10. A third insulating layer 305 may be disposed between the color filters 303 and the micro lenses 307.

The color filters 303 may include primary color filters. For example, the color filters 303 may include green, red, and blue filters. The color filters 303 may be arranged in a Bayer pattern. In an example embodiment, the color filters 303 may include color filters of other colors (e.g., cyan, magenta, or yellow).

The micro lenses 307 may have a convex shape, and this may make it possible to condense light, which is incident into the pixel regions PR. When viewed in a plan view, the micro lenses 307 may overlap the photoelectric conversion regions 110, respectively.

FIGS. 5A, 5B, 5C and 5D are enlarged sectional views illustrating a portion 'A' of FIG. 4. The pixel separation structure 150 and the device isolation pattern 103 will be described in more detail below.

Figure 5A:
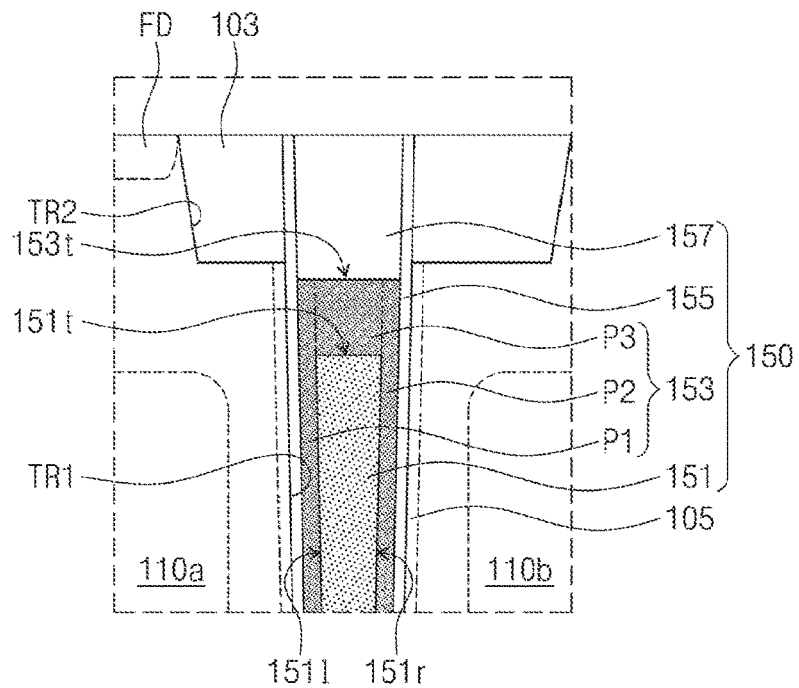
FIGS. 5A, 5B, 5C and 5D are enlarged sectional views illustrating a portion 'A' of FIG. 4.

Referring to FIGS. 3, 4, and 5A, a first trench TR1 may be formed to penetrate the semiconductor substrate 100 and to define the pixel regions PR. When viewed in a plan view, the first trench TR1 may have a lattice or grid structure.

A doped region 105 may be formed in the semiconductor substrate 100 and along an inner surface of the first trench TR1. The doped region 105 may be formed adjacent to a side surface of the pixel separation structure 150. The doped region 105 may be spaced apart from a first photoelectric conversion region 110a and a second photoelectric conversion region 110b. In an example embodiment, the doped region 105 may contain at least one of germanium, carbon, and boron as a dopant. The doped region 105 may be, for example, of a first conductivity type. The doped region 105 may have a doping concentration higher than that of a region of the semiconductor substrate 100, which is located between the doped region 105 and the photoelectric conversion regions 110a and 110b.

The pixel separation structure 150 may fill the first trench TR1. The pixel separation structure 150 may include an insulating pattern 155, a conductive pattern 153, a capping pattern 157, and a gapfill pattern 151. The insulating pattern 155 may cover the inner surface of the first trench TR1. The conductive pattern 153, the capping pattern 157, and the gapfill pattern 151 may fill the first trench TR1. The capping pattern 157 may fill an upper portion of the first trench TR1. The conductive pattern 153 may fill a lower portion of the first trench TR1. The gapfill pattern 151 may be provided in the conductive pattern 153.

The capping pattern 157 may be adjacent to the first surface 100a of the semiconductor substrate 100, and a top surface of the capping pattern 157 may be coplanar with the first surface 100a. The conductive pattern 153 may be adjacent to the second surface 100b of the semiconductor substrate 100, and a bottom surface of the conductive pattern 153 may be coplanar with the second surface 100b.

The insulating pattern 155 may extend from the first surface 100a of the semiconductor substrate 100 to the second surface 100b. The insulating pattern 155 may enclose each of the photoelectric conversion regions 110, when viewed in a plan view. The insulating pattern 155 may be interposed between the conductive pattern 153 and the semiconductor substrate 100. In other words, the conductive pattern 153 may be spaced apart from the semiconductor substrate 100 by the insulating pattern 155. The conductive pattern 153 may be electrically disconnected (i.e., isolated) from the semiconductor substrate 100 by the insulating pattern 155. The conductive pattern 153 may be formed of or include, for example, poly silicon doped with n- or p-type impurities. Each of the insulating pattern 155 and the capping pattern 157 may be formed of or include at least one of, for example, silicon oxide, silicon oxynitride, or silicon nitride.

The gapfill pattern 151 may be disposed in the conductive pattern 153. The gapfill pattern 151 may have a lattice or grid structure enclosing the pixel regions, when viewed in a plan view. A deep trench may be formed on a bottom surface of the conductive pattern 153, and the gapfill pattern 151 may be provided in the deep trench. A bottom surface of the gapfill pattern 151 may be exposed by the conductive pattern 153. In other words, the bottom surface of the gapfill pattern 151 may not be covered by the conductive pattern 153. For example, the bottom surface of the gapfill pattern 151 may be located at the same level as the bottom surface of the conductive pattern 153. A top surface 151t of the gapfill pattern 151 may be spaced apart from a bottom surface of the capping pattern 157 with the conductive pattern 153 interposed therebetween.

In more detail, the gapfill pattern 151 may extend from the second surface 100b of the semiconductor substrate 100 toward the first surface 100a. The bottom surface of the gapfill pattern 151 may be coplanar with the second surface 100b of the semiconductor substrate 100. The gapfill pattern 151 may be disposed between adjacent photoelectric conversion regions. For example, the first photoelectric conversion region 110a may be adjacent the second photoelectric conversion region 110b, and the gapfill pattern 151 may be provided between the first photoelectric conversion region 110a and the second photoelectric conversion region 110b. The gapfill pattern 151 may have a first side surface 151l facing the first photoelectric conversion region 110a and a second side surface 151r facing the second photoelectric conversion region 110b.

The conductive pattern 153 may include a first portion P1, a second portion P2, and a connection portion P3. The connecting portion P3 connects the first portion P1 to the second portion P2. The first portion P1 of the conductive pattern 153 may be provided on the first side surface 151l of the gapfill pattern 151, and the second portion P2 of the conductive pattern 153 may be provided on the second side surface 151r of the gapfill pattern 151. The first portion P1 and the second portion P2 of the conductive pattern 153 may be connected to each other through the connection portion P3. The connection portion P3 of the conductive pattern 153 may be provided on the top surface 151t of the gapfill pattern 151. In other words, the conductive pattern 153 may cover the first side surface 151l, the second side surface 151r, and the top surface 151t of the gapfill pattern 151.

The gapfill pattern 151 may include a material whose thermal expansion coefficient is different from that of the conductive pattern 153. For example, the gapfill pattern 151 may include one or more metal oxide material or metallic materials. The metal oxide materials for the gapfill pattern 151 may include indium tin oxide (ITO) and aluminum oxide ($Al_2O_3$). The metallic materials for the gapfill pattern 151 may include titanium nitride (TiN), tantalum nitride (TaN), tungsten (W), and copper (Cu). In an example embodiment, the gapfill pattern 151 may be formed of or include at least one of silicon carbon nitride (SiCN), silicon oxynitride (SiON), or silicon oxycarbide (SiOC). The gapfill pattern 151 may be configured to exert a compressive stress on the semiconductor substrate 100, and this compressive stress may be used to prevent the semiconductor substrate 100 from being deformed. As an example, the gapfill pattern 151 may be configured to prevent a void from being formed in the pixel separation structure 150 and to compensate a tensile stress, which may be exerted on the semiconductor substrate 100 during a high temperature process. Thus, it may be possible to prevent the semiconductor substrate 100 from being deformed.

In an example embodiment, the top surface 151t of the gapfill pattern 151 may be located at a level lower than a bottom surface of a second trench TR2, in which the device isolation pattern 103 is disposed. That is, the level of the top surface 151t of the gapfill pattern 151 may be lower than the level of the bottom surface of the device isolation pattern 103. In addition, a top surface 153t of the conductive pattern 153 may be located at a level lower than the bottom surface of the second trench TR2, in which the device isolation pattern 103 is disposed. That is, the level of the top surface of the conductive pattern 153 may be lower than the level of the bottom surface of the device isolation pattern 103.

A conductive line CL may be provided on the second surface 100b of the semiconductor substrate 100. The conductive line CL may be electrically connected to the conductive pattern 153 of the pixel separation structure 150. As an example, the conductive line CL may be in direct contact with the bottom surface of the conductive pattern 153.

A negative voltage may be applied to the conductive line CL. As an example, the conductive line CL may be electrically connected to a charge pump, and a negative voltage generated by the charge pump may be applied to the conductive line CL. In an example embodiment, the negative voltage generated by the charge pump may be a constant voltage. The negative voltage may be applied to the conductive pattern 153 through the conductive line CL. A positive charge produced in the pixel region PR may be removed through the conductive pattern 153 surrounding the pixel region PR. Thus, it may be possible to improve a dark current property of the image sensor. The conductive line CL may be in direct contact with the first portion P1 and the second portion P2 of the conductive pattern 153. In addition, the conductive line CL may be in direct contact with the gapfill pattern 151. Because, as described above, the conductive pattern 153 has the connection portion P3 connecting the first portion P1 to the second portion P2, the negative voltage applied to the conductive line CL may be delivered to the entire portion of the conductive pattern 153.

The second trench TR2 may be formed to define the first to third active patterns ACT1, ACT2, and ACT3 of the pixel region PR. The second trench TR2 may have a shape recessed from the first surface 100a toward the second surface 100b. The second trench TR2 may be shallower than the first trench TR1. The device isolation pattern 103 may fill the second trench TR2. A bottom surface of the pixel separation structure 150 may be closer to the second surface 100b than to the bottom surface of the device isolation pattern 103.

Figure 5B:
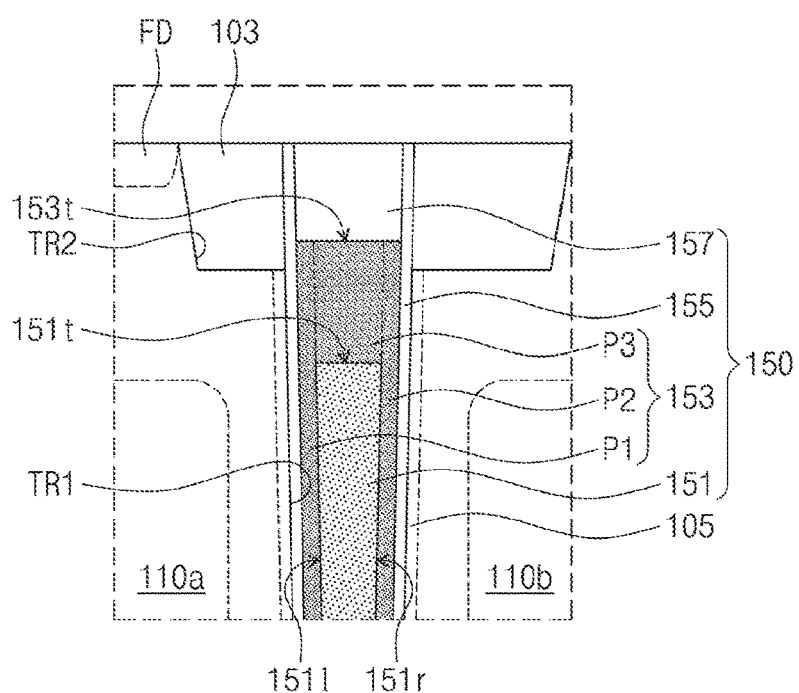

In an example embodiment, as shown in FIG. 5B, the top surface 153t of the conductive pattern 153 may be located at a level higher than the bottom surface of the second trench TR2, in which the device isolation pattern 103 is disposed. That is, the level of the top surface 153t of the conductive pattern 153 may be higher than the level of the bottom surface of the device isolation pattern 103.

Figure 5C:
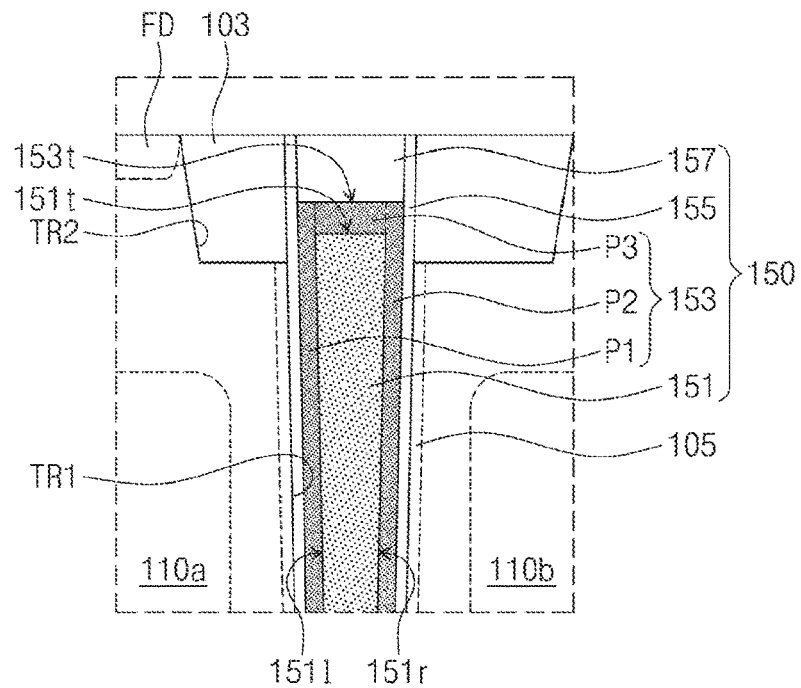

In an example embodiment, as shown in FIG. 5C, the top surface 151t of the gapfill pattern 151 may be located at a level higher than the bottom surface of the second trench TR2, in which the device isolation pattern 103 is disposed. That is, the level of the top surface 151t of the gapfill pattern 151 may be higher than the level of the bottom surface of the device isolation pattern 103. The top surface 153t of the conductive pattern 153 may also be located at a level higher than the bottom surface of the second trench TR2, in which the device isolation pattern 103 is disposed.

Figure 5D:
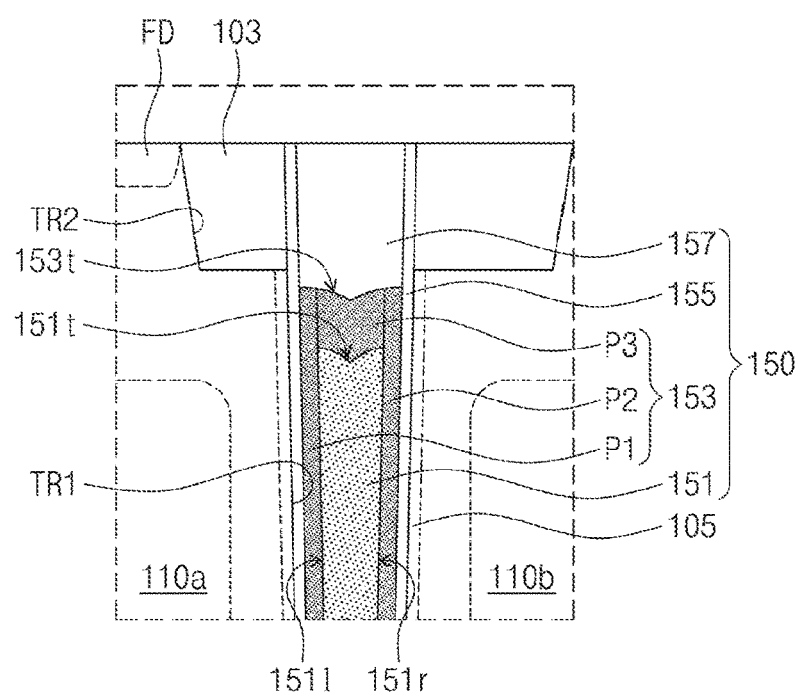

In an example embodiment, as shown in FIG. 5D, the top surface 153t of the conductive pattern 153 may have a shape that is concavely recessed toward the top surface 151t of the gapfill pattern 151. Furthermore, the top surface 151t of the gapfill pattern 151 may also have a shape that is concavely recessed toward the second surface 100b of the semiconductor substrate 100.

Figure 6A:
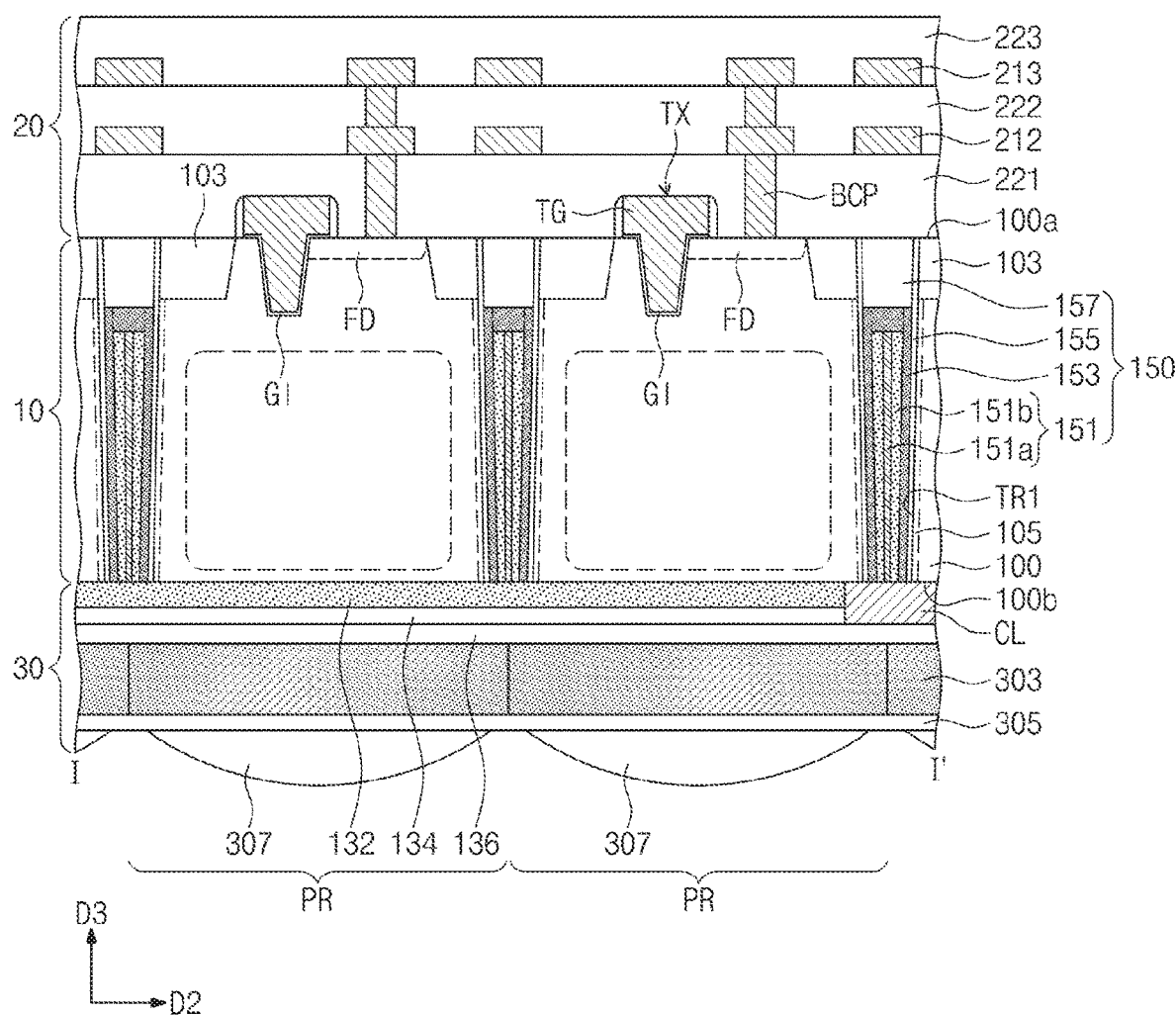
FIGS. 6A, 6B and 6C are sectional views, each of which is taken along a line I-I' of FIG. 3 to illustrate an image sensor according to an example embodiment.
Figure 6B:
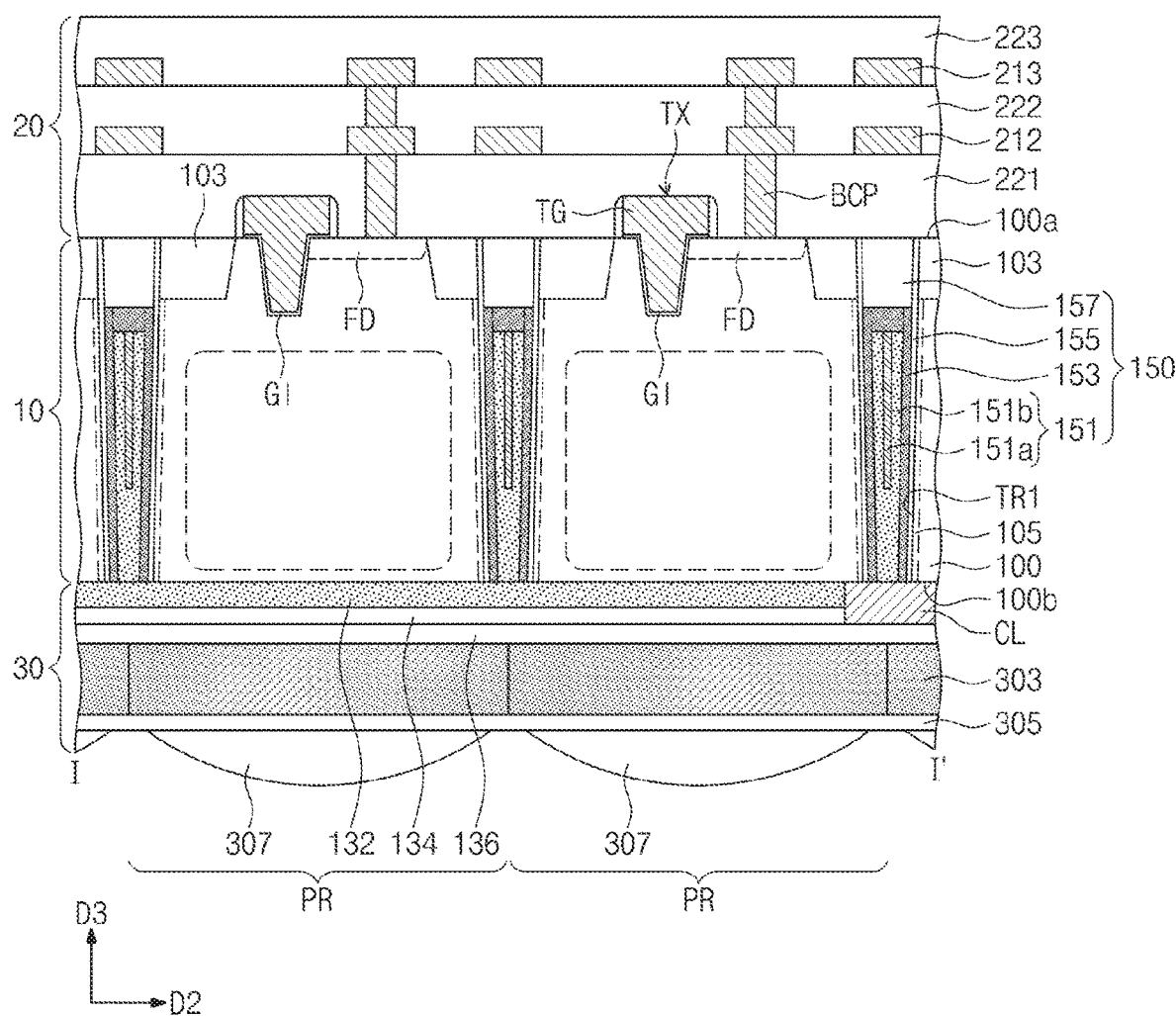
Figure 6C:
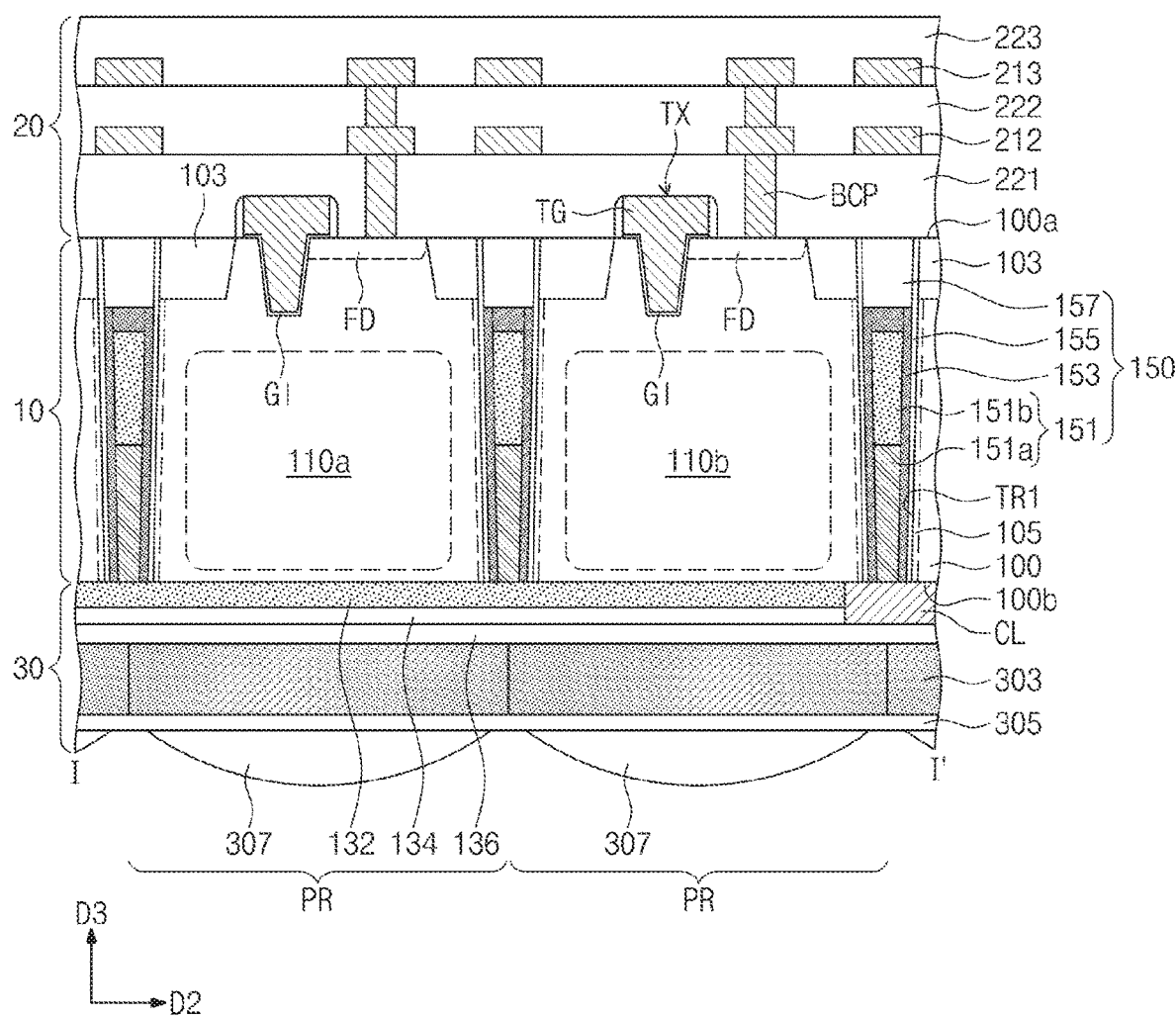

FIGS. 6A, 6B and 6C are sectional views, each of which is taken along a line I-I' of FIG. 3 to illustrate an image sensor according to an example embodiment. For concise description, a previously described element may be identified by the same reference number without repeating an overlapping description thereof.

Referring to FIGS. 6A and 6B, the gapfill pattern 151 may include a first pattern 151a and a second pattern 151b surrounding the first pattern 151a. The first pattern 151a may include at least one of indium tin oxide (ITO), aluminum oxide ($Al_2O_3$), titanium nitride (TiN), tantalum nitride (TaN), tungsten (W), copper (Cu), silicon carbon nitride (SiCN), silicon oxynitride (SiON), or silicon oxycarbide (SiOC). The second pattern 151b may include at least one, which is selected from the above materials but is different from that of the first pattern 151a. Here, the first pattern 151a may include a material having a higher refractive index than the second pattern 151b.

The first pattern 151a may extend from a top surface of the second pattern 151b to a bottom surface of the second pattern 151b, as shown in FIG. 6A. For example, both of the first pattern 151a and the second pattern 151b may be in direct contact with the conductive line CL.

In an example embodiment, as shown in FIG. 6B, the first pattern 151a may have a bottom surface, which is located at a level higher than the bottom surface of the second pattern 151b. For example, a portion of the second pattern 151b may be interposed between the bottom surface of the first pattern 151a and the second surface 100b of the semiconductor substrate 100.

Referring to FIG. 6C, the gapfill pattern 151 may include a first pattern 151a and a second pattern 151b, which is located on the top surface of the first pattern 151a. A bottom surface of the second pattern 151b may be located at a level higher than the second surface 100b of the semiconductor substrate 100. The second pattern 151b may be spaced apart from the conductive line CL with the first pattern 151a interposed therebetween.

FIGS. 7 to 15 are sectional views illustrating a method of fabricating an image sensor, according to an example embodiment.

Figure 7:
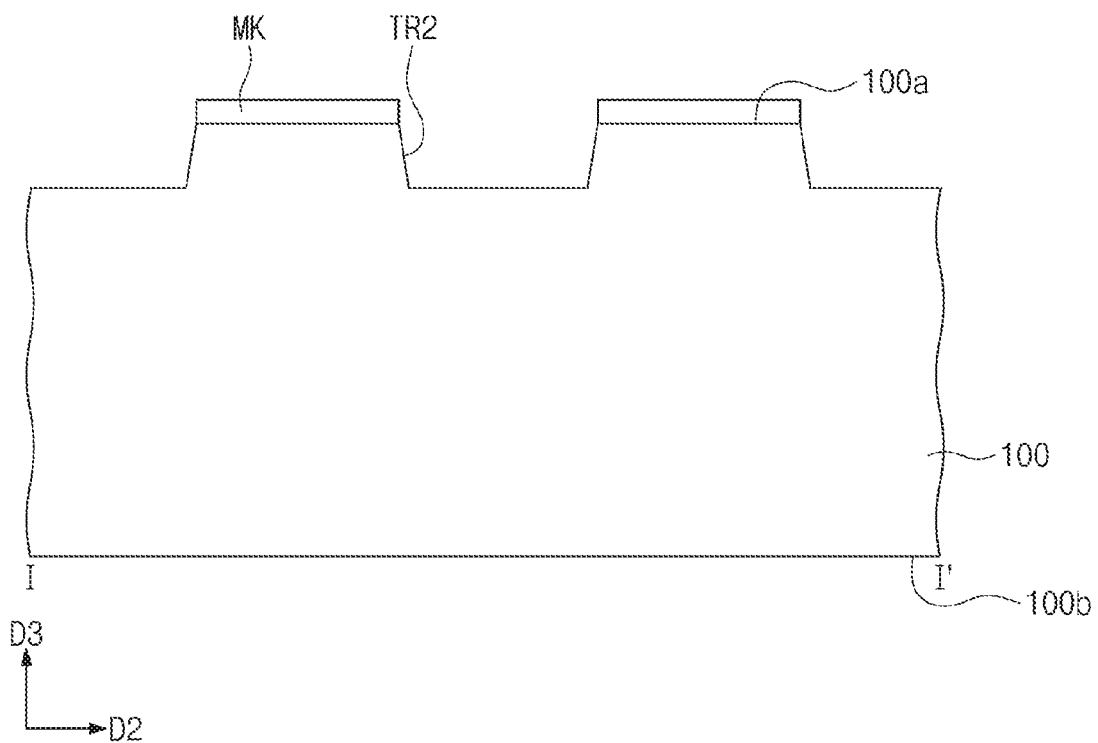
FIGS. 7, 8, 9, 10, 11, 12, 13, 14, and 15 are sectional views illustrating a method of fabricating an image sensor, according to an example embodiment.

Referring to FIG. 7, the semiconductor substrate 100 of a first conductivity type (e.g., p-type) may be provided. The semiconductor substrate 100 may have the first surface 100a and the second surface 100b facing each other. In an example embodiment, the semiconductor substrate 100 may be a bulk silicon substrate of a first conductivity type and an epitaxial layer of the first conductivity type formed on the bulk silicon substrate. In an example embodiment, the semiconductor substrate 100 may be a bulk semiconductor substrate, in which a well region of the first conductivity type is formed.

The second trench TR2 may be formed on or in the first surface 100a of the semiconductor substrate 100. The formation of the second trench TR2 may include forming a mask pattern MK on the first surface 100a of the semiconductor substrate 100 and performing an etching process on the first surface 100a using the mask pattern MK.

Figure 8:
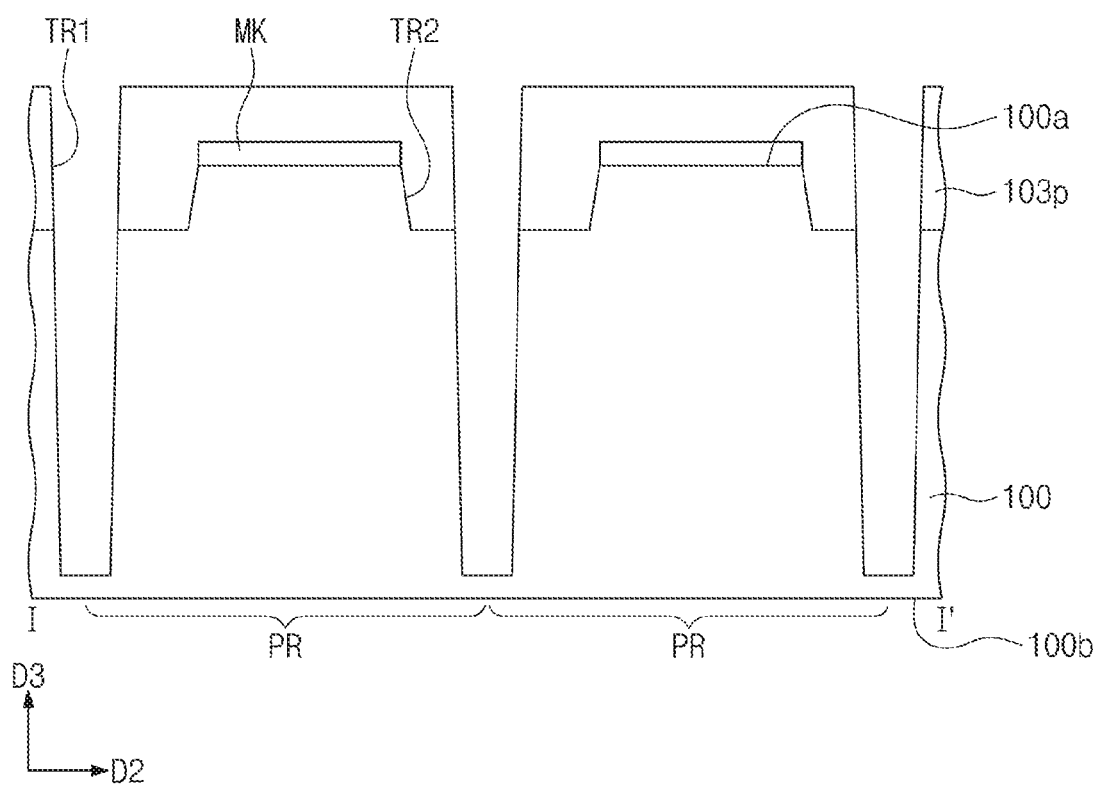

Referring to FIG. 8, the first trench TR1 may be formed on the first surface 100a of the semiconductor substrate 100. In an example embodiment, a first insulating layer 103p may be formed on the first surface 100a of the semiconductor substrate 100, before the formation of the first trench TR1. The first insulating layer 103p may be formed to completely fill the second trench TR2 and to cover the mask pattern MK. The first insulating layer 103p may be formed to have a top surface higher than the first surface 100a of the semiconductor substrate 100. In this case, the first trench TR1 may be formed by forming a mask on the first insulating layer 103p and anisotropically etching the first insulating layer 103p and the semiconductor substrate 100.

Figure 9:
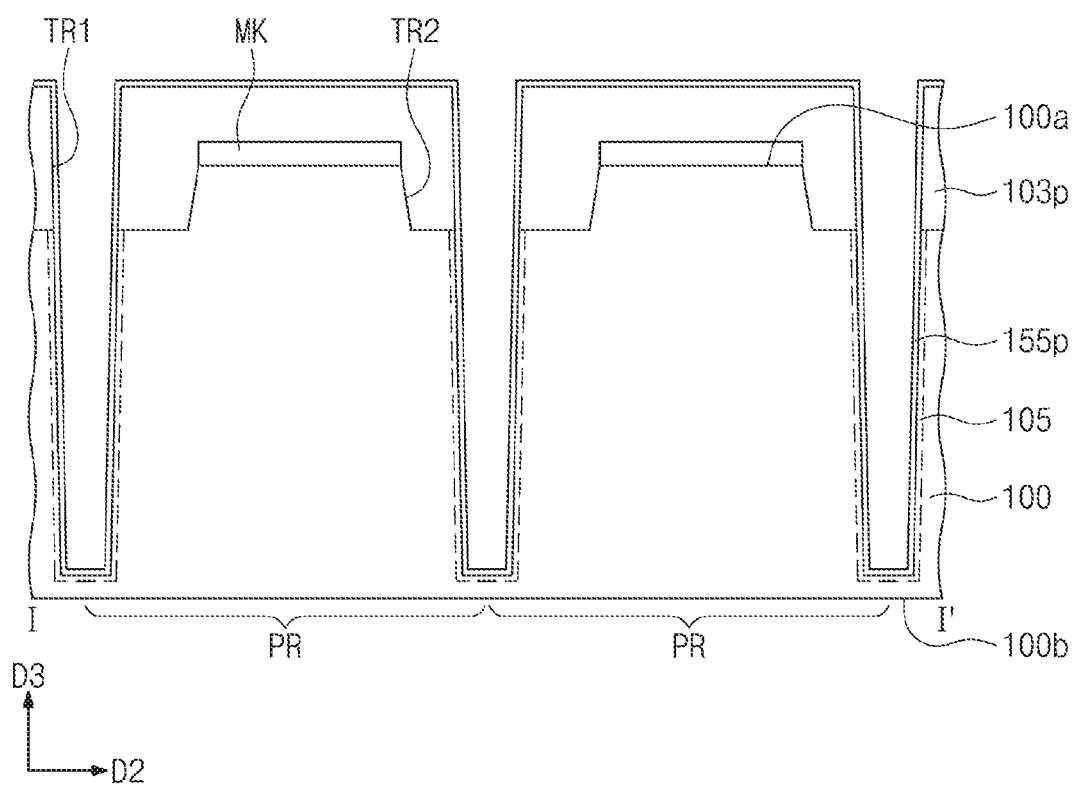

Referring to FIG. 9, a preliminary insulating pattern 155p may be formed to conformally cover an inner surface of the first trench TR1. The preliminary insulating pattern 155p may cover a top surface of the first insulating layer 103p. The preliminary insulating pattern 155p may be formed by depositing an insulating material of a uniform thickness on the semiconductor substrate 100, in which the first trench TR1 is formed. The preliminary insulating pattern 155p may include at least one of, for example, silicon oxide, silicon nitride, or silicon oxynitride. In an example embodiment, before the formation of the preliminary insulating pattern 155p, an ion doping process may be performed to form the doped region 105 along the inner surface of the first trench TR1.

Figure 10:
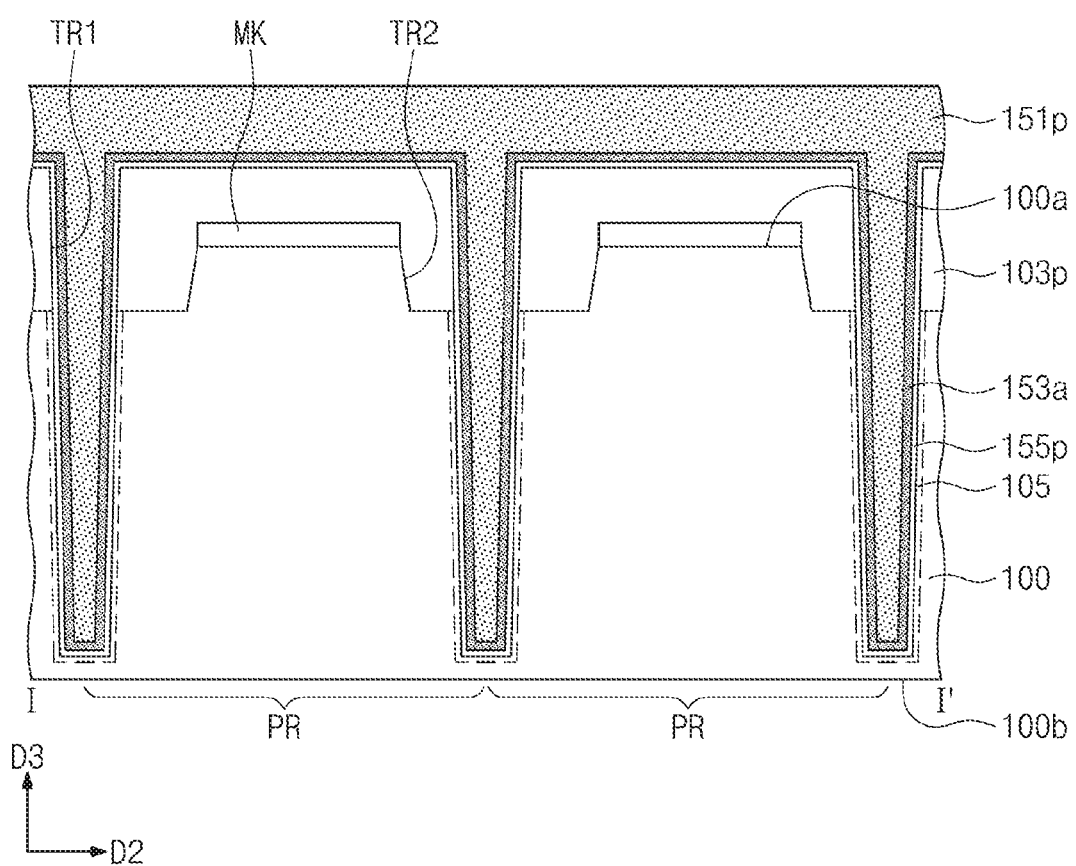

Referring to FIG. 10, a first preliminary conductive layer 153a and a buried layer 151p may be formed on the preliminary insulating pattern 155p. In detail, the formation of the first preliminary conductive layer 153a may include depositing a conductive material of a uniform thickness on the semiconductor substrate 100 covered with the preliminary insulating pattern 155p. Thereafter, the buried layer 151p may be formed on the semiconductor substrate 100 to fill the remaining space of the first trench TR1.

Figure 11:
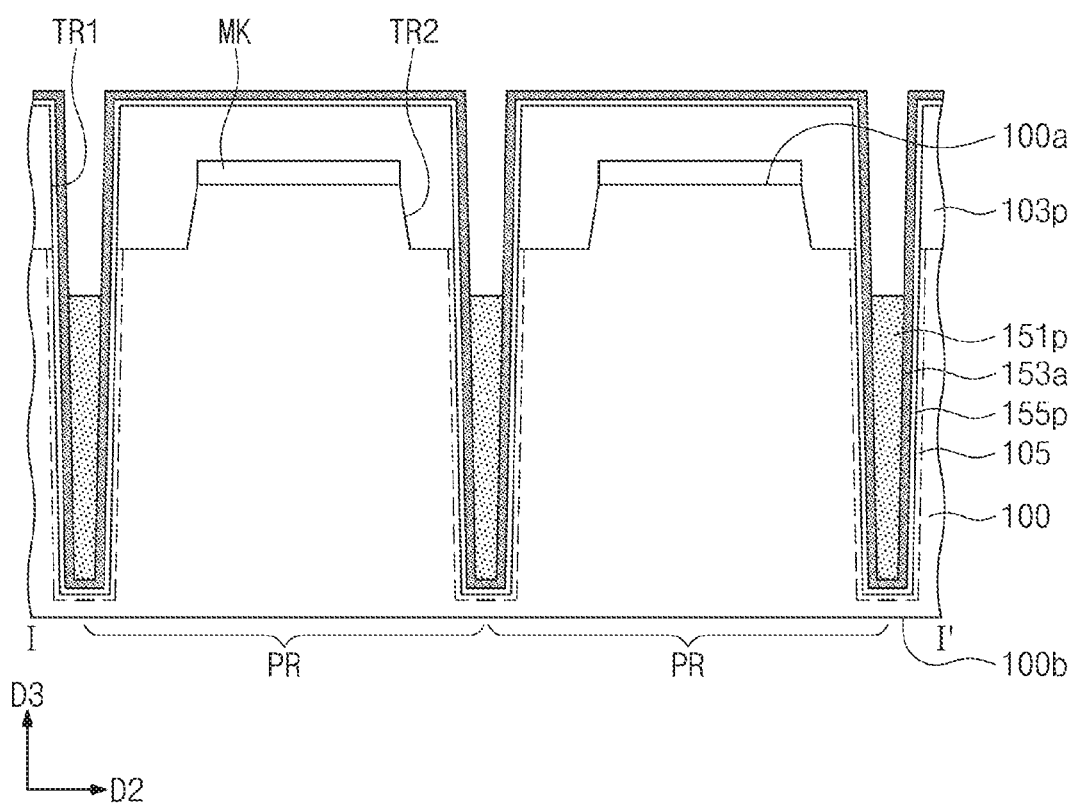

Referring to FIG. 11, the gapfill pattern 151 may be formed from the buried layer 151p. For example, the gapfill pattern 151 may be formed by performing an etch-back process on the buried layer 151p to vertically recess a portion of the buried layer 151p. The gapfill pattern 151 may be formed to fill a lower region of the first trench TR1. The top surface of the gapfill pattern 151 may be located at a level lower than the top surface of the semiconductor substrate 100.

Figure 12:
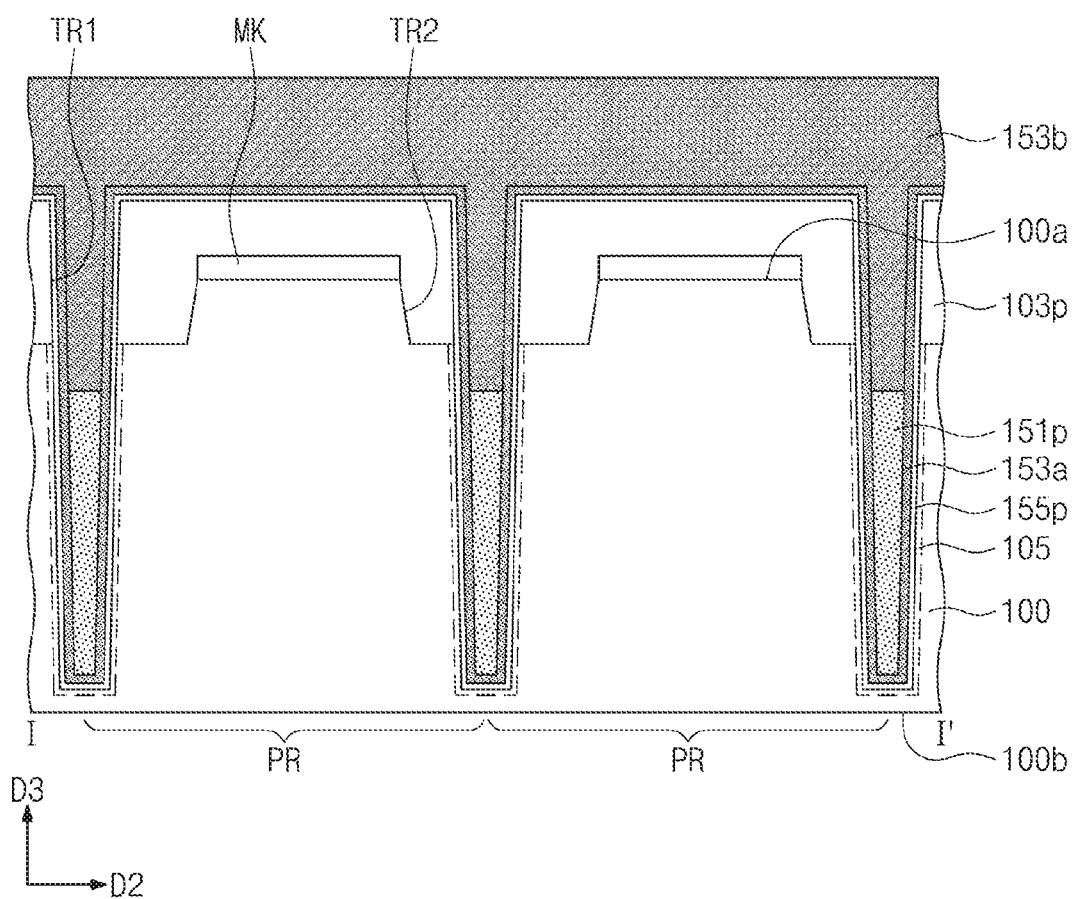

Referring to FIG. 12, a second preliminary conductive layer 153b may be formed to fill an empty space of the first trench TR1. For example, the second preliminary conductive layer 153b may be formed of the same material as the first preliminary conductive layer 153a. The second preliminary conductive layer 153b may be formed by a deposition process and may be formed to fill the empty space of the first trench TR1, which is formed by the vertical recess of the buried layer 151p. In an example embodiment, in the case where the second preliminary conductive layer 153b is formed by the deposition process, a top surface of the second preliminary conductive layer 153b may be formed to have a recess portion, which is vertically overlapped with the first trench TR1.

Figure 13:
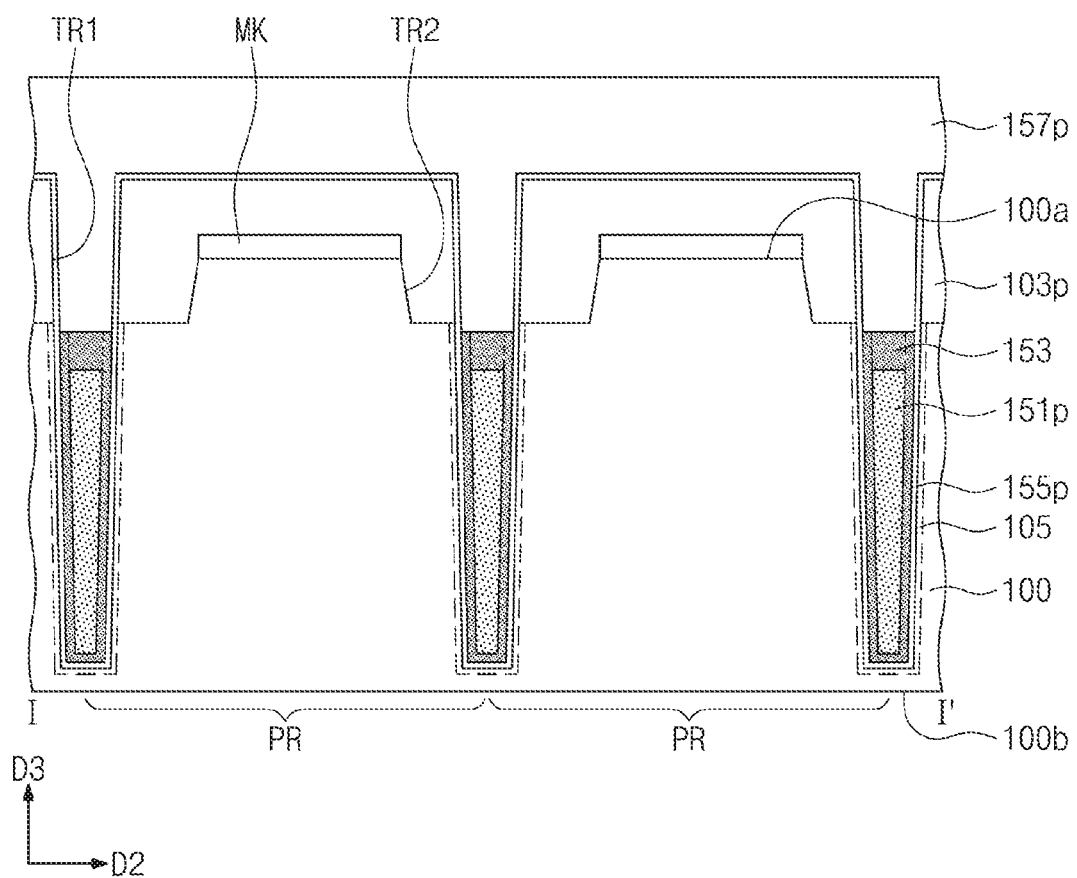

Referring to FIGS. 12 and 13, an isotropic etching process may be performed on the first preliminary conductive layer 153a and the second preliminary conductive layer 153b to form the conductive pattern 153. The isotropic etching process on the first preliminary conductive layer 153a and the second preliminary conductive layer 153b may be performed by a wet etching process. As an example, in the case where the first preliminary conductive layer 153a and the second preliminary conductive layer 153b include polysilicon, an etching solution containing a mixture of hydrofluoric acid (HF), nitric acid (HNO3), and acetic acid (CH3COOH) may be used to etch both of the first preliminary conductive layer 153a and the second preliminary conductive layer 153b in a wet etching manner.

In an example embodiment, as a result of the isotropic etching process on the first preliminary conductive layer 153a and the second preliminary conductive layer 153b, a portion of the first preliminary conductive layer 153a may remain on a side surface of the gapfill pattern 151, and a portion of the second preliminary conductive layer 153b may remain on the top surface of the gapfill pattern 151. The remaining portion of the first preliminary conductive layer 153a may constitute the first and second portions P1 and P2 of the conductive pattern 153 described with reference to FIG. 5A, and the remaining portion of the second preliminary conductive layer 153b may constitute the connection portion P3 of the conductive pattern 153.

Thereafter, a capping layer 157p may be formed to cover the semiconductor substrate 100 and to fill an upper portion of the first trench TR1. The formation of the capping layer 157p may include performing a deposition process on the first surface 100a of the semiconductor substrate 100. The capping layer 157p may include at least one of silicon oxide, silicon nitride, or silicon oxynitride.

Figure 14:
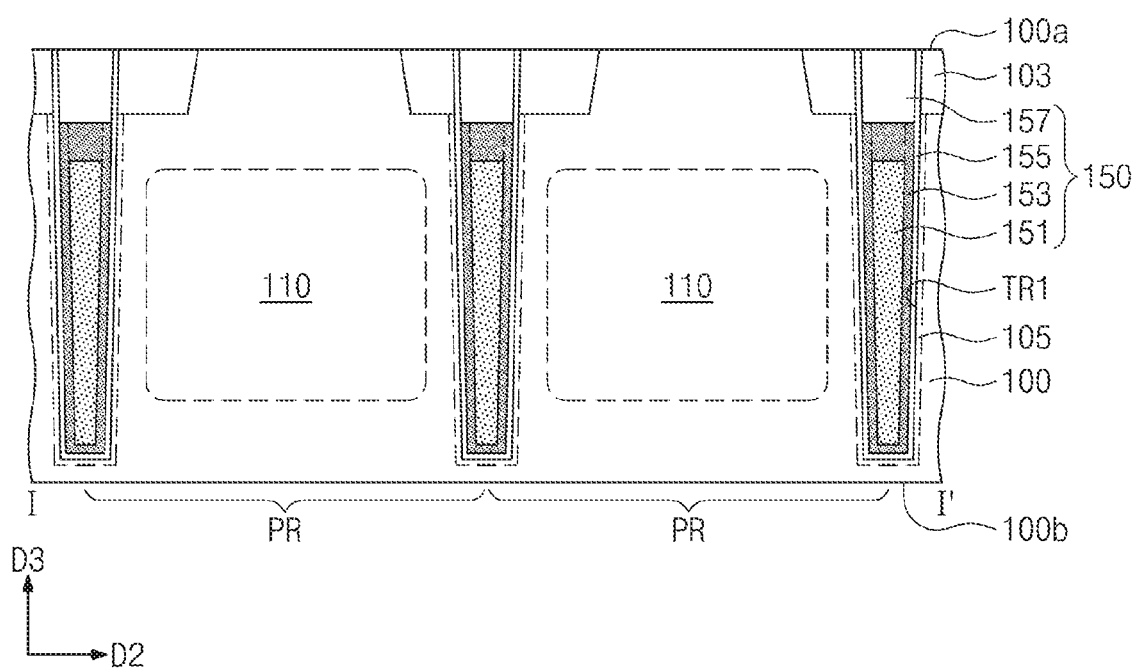

Referring to FIG. 14, the capping pattern 157 and the device isolation pattern 103 may be formed. The formation of the capping pattern 157 and the device isolation pattern 103 may include performing a planarization process on the first surface 100a of the semiconductor substrate 100. In an example embodiment, the mask pattern MK may be removed after the planarization process, and thus, it may be possible to prevent the first surface 100a of the semiconductor substrate 100 from being damaged by the planarization process.

The photoelectric conversion regions 110 may be formed by doping the pixel regions PR with impurities. The photoelectric conversion regions 110 may be formed to have a second conductivity type (e.g., n-type), which is different from the first conductivity type (e.g., p-type).

Figure 15:
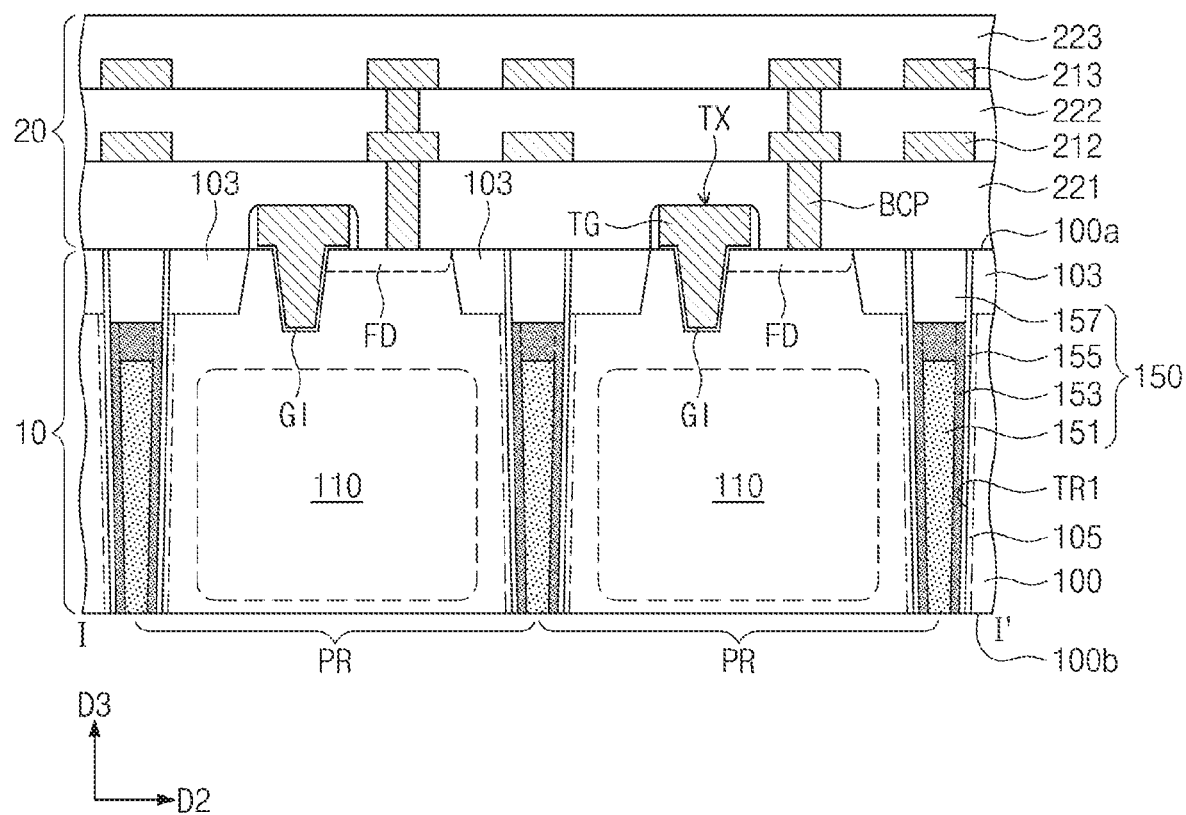

Referring to FIG. 15, a thinning process may be performed to remove a portion of the semiconductor substrate 100 or to reduce a vertical thickness of the semiconductor substrate 100. The thinning process may include performing a grinding or polishing process on the second surface 100b of the semiconductor substrate 100 and performing an anisotropic or isotropic etching process on the second surface 100b of the semiconductor substrate 100. The semiconductor substrate 100 may be inverted during the thinning process. The grinding or polishing process may be performed to remove a portion of the semiconductor substrate 100 adjacent to the second surface 100b, and then, the anisotropic or isotropic etching process may be performed to remove surface defects from the ground or polished surface of the semiconductor substrate 100.

As a result of the thinning process on the second surface 100b of the semiconductor substrate 100, surfaces of the gapfill pattern 151, the conductive pattern 153, and the insulating pattern 155 may be exposed. The gapfill pattern 151, the conductive pattern 153, and the insulating pattern 155 may have bottom surfaces, which are located at substantially the same level as the second surface 100b of the semiconductor substrate 100.

Thereafter, the transfer transistor TX may be formed on the first active pattern ACT1 of each of the pixel regions PR, the drive transistor DX and the selection transistor SX may be formed on the second active pattern ACT2, and the reset transistor RX may be formed on the third active pattern ACT3.

In detail, the formation of the transfer transistor TX may include doping the first active pattern ACT1 to form the floating diffusion region FD and forming the transfer gate TG on the first active pattern ACT1. The formation of the drive transistor DX and the selection transistor SX may include doping the second active pattern ACT2 to form an impurity region DR and forming the drive gate DG and the selection gate SG on the second active pattern ACT2. The formation of the reset transistor RX may include doping the third active pattern ACT3 to form the impurity region DR and forming the reset gate RG on the third active pattern ACT3.

The first interlayered insulating layer 221 may be formed on the first surface 100a of the semiconductor substrate 100. The first interlayered insulating layer 221 may be formed to cover the transfer transistors TX and the logic transistors RX, SX, and DX, which are formed on the first surface 100a of the semiconductor substrate 100.

The second and third interlayered insulating layers 222 and 223 may be sequentially formed on the first interlayered insulating layer 221. The first and second interconnection lines 212 and 213 may be formed in the second and third interlayered insulating layers 222 and 223, respectively.

Referring back to FIG. 4, the anti-reflection layer 132, the first insulating layer 134, and the second insulating layers 136 may be sequentially formed on the second surface 100b of the semiconductor substrate 100. The conductive line CL may be formed on the second surface 100b of the semiconductor substrate 100. The conductive line CL may be electrically connected to the conductive pattern 153 of the pixel separation structure 150. The color filters 303 may be formed on the pixel regions PR, respectively. The micro lenses 307 may be formed on the color filters 303, respectively.

According to an example embodiment, an image sensor, which is configured to suppress a dark current and to prevent its semiconductor substrate from being deformed, can be provided.

While example embodiments have been particularly shown and described, it will be understood by one of ordinary skill in the art that variations in form and detail may be made therein without departing from the spirit and scope of the attached claims.

What is claimed is:

1. An image sensor, comprising:
 a semiconductor substrate having a first surface and a second surface, the first surface and the second surface facing each other;
 a first photoelectric conversion region provided in the semiconductor substrate;
 a second photoelectric conversion region provided in the semiconductor substrate;
 a gapfill pattern that is interposed between the first photoelectric conversion region and the second photoelectric conversion region and extends from the second surface toward the first surface, wherein a first side surface of the gapfill pattern faces the first photoelectric conversion region and a second side surface of the gapfill pattern faces the second photoelectric conversion region; and
 a conductive pattern disposed on the gapfill pattern,
 wherein the conductive pattern comprises a first portion disposed on the first side surface, a second portion disposed on the second side surface, and a connecting portion that is disposed on a top surface of the gapfill pattern and electrically connects the first portion to the second portion.

2. The image sensor of claim 1, wherein the gapfill pattern has a lattice structure and encloses the first photoelectric conversion region and the second photoelectric conversion region, when viewed in a plan view.

3. The image sensor of claim 1, wherein a bottom surface of the gapfill pattern and a bottom surface of the conductive pattern are coplanar with the second surface of the semiconductor substrate.

4. The image sensor of claim 1, further comprising a capping pattern disposed on the conductive pattern,
 wherein a top surface of the capping pattern is coplanar with the first surface.

5. The image sensor of claim 1, further comprising a transfer gate disposed on the first surface of the semiconductor substrate.

6. The image sensor of claim 1, further comprising an insulating pattern interposed between the conductive pattern and the semiconductor substrate,
 wherein the conductive pattern is electrically isolated from the semiconductor substrate by the insulating pattern.

7. The image sensor of claim 1, wherein a refractive index of the gapfill pattern is higher than a refractive index of the conductive pattern.

8. The image sensor of claim 1, further comprising a conductive line provided on the second surface and electrically connected to the conductive pattern.

9. The image sensor of claim 8, wherein a bottom surface of the gapfill pattern and a bottom surface of the conductive pattern are in contact with the conductive line.

10. The image sensor of claim 1, wherein a top surface of the conductive pattern is concavely recessed toward the gapfill pattern.

11. An image sensor, comprising:
 a semiconductor substrate comprising a plurality of pixel regions interposed between a first surface and a second surface of the semiconductor substrate; and
 a pixel separation structure that extends from the first surface to the second surface and separates the plurality of pixel regions from each other,
 wherein the pixel separation structure comprises a conductive pattern, a capping pattern disposed on the conductive pattern, and a gapfill pattern provided in the conductive pattern,
 wherein a bottom surface of the gapfill pattern is exposed through the conductive pattern, and
 wherein a top surface of the gapfill pattern is spaced apart from a bottom surface of the capping pattern, with the conductive pattern interposed therebetween.

12. The image sensor of claim 11, wherein the gapfill pattern has a lattice structure and encloses each of the plurality of pixel regions.

13. The image sensor of claim 11, wherein a bottom surface of the conductive pattern and the bottom surface of the gapfill pattern are coplanar with the second surface.

14. The image sensor of claim 11, further comprising a plurality of transfer gates, wherein one of the plurality of transfer gates is respectively disposed on the first surface of the semiconductor substrate in each of the plurality of pixel regions.

15. The image sensor of claim 11, wherein a refractive index of the gapfill pattern is higher than a refractive index of the conductive pattern.

16. The image sensor of claim 11, further comprising an insulating pattern interposed between the conductive pattern and the semiconductor substrate,
wherein the conductive pattern is electrically isolated from the semiconductor substrate by the insulating pattern.

17. An image sensor, comprising:
a semiconductor substrate having a first surface and a second surface, and comprising a pixel region with a photoelectric conversion region;
a pixel separation structure having a lattice structure that encloses the pixel region, the pixel separation structure comprising a conductive pattern, a capping pattern disposed on the conductive pattern, and a gapfill pattern provided in the conductive pattern;
a device isolation pattern formed in the semiconductor substrate, adjacent to the first surface, and in contact with the pixel separation structure; and
a transfer gate disposed on the first surface of the semiconductor substrate,
wherein a top surface of the device isolation pattern is coplanar with a top surface of the capping pattern, and
wherein a bottom surface of the conductive pattern is coplanar with a bottom surface of the gapfill pattern.

18. The image sensor of claim 17, wherein a top surface of the gapfill pattern is spaced apart from a bottom surface of the capping pattern, with the conductive pattern interposed therebetween.

19. The image sensor of claim 17, wherein a top surface of the gapfill pattern is located at a level higher than a bottom surface of the device isolation pattern.

20. The image sensor of claim 17, wherein a top surface of the gapfill pattern is concavely recessed toward the second surface.

* * * * *